United States Patent [19]
Moyer et al.

[11] Patent Number: 5,644,270
[45] Date of Patent: Jul. 1, 1997

[54] ENCHANCED STABILITY VOLTAGE CONTROLLED RC OSCILLATOR

[75] Inventors: Todd K. Moyer, Wilsonville, Oreg.; Daniel M. Clementi, Doylestown, Pa.

[73] Assignee: ICS Technologies, Inc., Valley Forge, Pa.

[21] Appl. No.: 618,413

[22] Filed: Mar. 15, 1996

[51] Int. Cl.[6] .............................................. H03K 3/0231
[52] U.S. Cl. .............................. 331/34; 331/111; 331/143; 331/177 R
[58] Field of Search .............................. 331/34, 111, 143, 331/177 R

[56] References Cited

U.S. PATENT DOCUMENTS

| 4,873,497 | 10/1989 | Kielmeyer, Jr. | 331/177 R |
|---|---|---|---|
| 5,508,664 | 4/1996 | Rizzo | 331/143 |

*Primary Examiner*—Siegfried H. Grimm
*Attorney, Agent, or Firm*—Townsend and Townsend and Crew LLP

[57] ABSTRACT

A voltage controlled oscillator having substantial frequency dependence on a parallel RC timing element including a voltage-variable resistance element, such as a MOSFET biased in the triode region. One terminal of the timing element can be connected to ground. The voltage used to tune the timing element, to lock the voltage controlled oscillator to a reference frequency can be used to control similar timing elements integrated upon the same circuit, for example a continuous-time filter in an ethernet transceiver. The oscillator frequency is substantially independent of variations in supply voltage.

36 Claims, 5 Drawing Sheets

ENCHANCED STABILITY VOLTAGE CONTROLLED RC OSCILLATOR

BACKGROUND OF THE INVENTION

The present invention relates to a voltage controlled oscillator (VCO), and more particularly to a circuit for a VCO suitable for manufacture as a monolithic integrated circuit.

Voltage controlled oscillators have many applications in generating an oscillating voltage whose frequency is dependent upon a control voltage. One application of a voltage controlled oscillator is in a phase locked loop (PLL) in which the output of the oscillator is locked to an input frequency and the control voltage of the VCO is used as a reference voltage for other circuits. For example, it may be desirable to adjust the frequency response of a filter circuit as a function of the input frequency.

U.S. Pat. No. 5,243,239 discloses an integrated MOSFET oscillator using storage cells to effect trimming of current and voltage. A constant current oscillator is disclosed which uses a capacitor charged by a constant current as a timing element, with the capacitor being discharged by a MOSFET connected across it. The MOSFET is used as a switch to discharge the capacitor, and the frequency of oscillation is not substantially dependent on its linear resistance.

It would be desirable to provide a voltage controlled oscillator whose input frequency is not substantially affected by variations in supply voltage. It would also be desirable to provide a voltage controlled oscillator whose frequency is substantially dependent on a control voltage applied to a timing element, preferably a grounded timing element, where a similar timing element could be incorporated in another circuit, for example a filter. The VCO could be incorporated in an integrated circuit having several timing elements in filters. The output of the VCO can be locked to a reference frequency, e.g., using a phase locked-loop (PLL), and the tuning voltage used to tune the filters, e.g. continuous time filters. Such an integrated circuit could be used in an Ethernet transceiver.

SUMMARY OF THE INVENTION

An object of the present invention is to provide a VCO whose output frequency is substantially dependent on the tuning voltage applied to a voltage-variable RC timing element, and which is substantially independent of supply voltage fluctuations.

In the present invention, a VCO incorporates an RC timing element as a frequency determining component, the resistor being provided by a voltage-variable resistance element whose resistance is dependent on the timing voltage input. The capacitor is provided with current from a current source whose output is also dependent on the tuning voltage. This results in a substantial dependence of the oscillator frequency on the tuning voltage.

Preferably, both the RC timing element and the current source include voltage-variable resistor elements having similar properties. A corresponding voltage-variable resistor element having similar properties can be included in a further circuit, such as a filter.

An embodiment of the present invention provides a voltage controlled oscillator arranged for connection to first and second supply voltages and to a control voltage input that provides an output having a frequency that is dependent on the control voltage input. The voltage controlled oscillator includes an RC timing element comprising a capacitor element and a voltage-variable resistor element, preferably connected in parallel, wherein the voltage-variable resistor element has an input for varying its resistance that is coupled to the control voltage input. Advantageously, one terminal of the voltage variable resistor element is coupled to ground. The voltage-variable resistor element can be a field effect transistor, for example, a MOSFET, having gate, drain, and source terminals. The control voltage input is coupled to the gate, with the source and drain terminals coupled across the capacitor element.

The voltage controlled oscillator further includes circuitry to supply a predetermined current to the timing element to charge the capacitor until the voltage across the timing element exceeds a first predetermined threshold, and thereafter to cut off the supply of current until the capacitor has discharged through the voltage-variable resistor to a second predetermined threshold voltage before resuming supply of the predetermined current, thereby producing repetitive oscillations. A comparator can be arranged to switch the predetermined current on and off in response to a voltage detected across the timing element.

The predetermined current is adjusted in dependence on the control voltage input. Increasing the control voltage decreases the resistance of the voltage-variable resistor, which tends to decrease the amount of time needed to charge the capacitor. By making the predetermined current dependent on the resistance of the voltage-variable resistor, the grounded parallel RC network can control the frequency of oscillation without a dependence on the supply voltage.

The predetermined current can be derived from the current flowing through the further voltage-variable resistor by means of a current mirror. Most preferably, the predetermined current is a predetermined multiple of the current through the voltage-variable resistor, the multiple being greater than one and preferably 2 or close to 2. The VCO could be incorporated in an integrated circuit having several timing elements in filters. The output of the VCO can be locked to a reference frequency, e.g., using a phase locked-loop (PLL), and the tuning voltage used to tune the filters. Such an integrated circuit could be used in an ethernet transceiver.

DESCRIPTION OF THE PREFERRED EMBODIMENT

Figure 1:
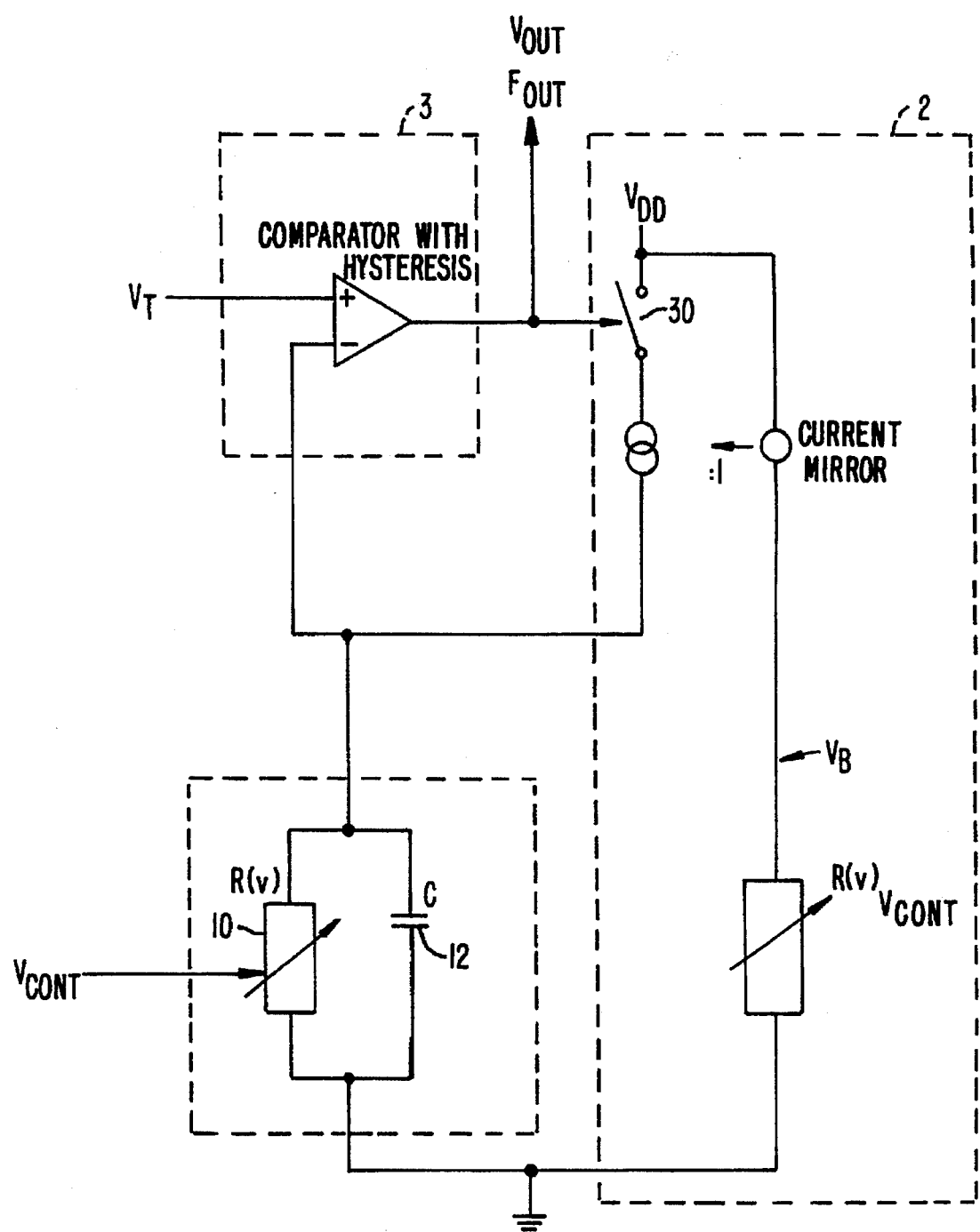
FIG. 1 is a simplified block diagram of a VCO according to the present invention.

Referring to the simplified block diagram shown in FIG. 1, the operation of the circuit is explained.

A timing element 1 comprises a resistance element R(v), whose resistance is dependent on a voltage applied to a control terminal, and a capacitor C connected in parallel. Assuming the voltage across the timing element is zero, the capacitor is initially supplied with current from a switchable constant-current source 2. The capacitor charges, and the increasing voltage across the timing element is fed to a comparator with hysteresis 3 connected to a switch element 30 of the constant-current source.

When the voltage across the timing element exceeds a first switching threshold $V_{T+}$ of the comparator, the comparator disables switch 30, turning off the supply of current. The capacitor then discharges through the voltage variable resistor until it falls to a second switching threshold $V_{T-}$, lower than the first switching threshold, at which point the comparator enables switch 30, turning on the supply of current again, and the cycle repeats. Thus, the voltage across the timing element oscillates between $V_{T+}$ and $V_{T-}$. Preferably, the difference between these two voltages is at least 10% of the supply voltage, more typically at least about 40%. These two voltages must be relatively low and close together to keep the MOSFET in its triode region over the whole range.

It will be appreciated that oscillating voltages and currents will exist at many points in the circuit, and the output could in principle be obtained or derived from any of these, all of which are directly or indirectly related to the voltage across the timing element. In the preferred embodiment, the output is obtained from the comparator output, which provides a buffered square-wave output. Other buffering and pulse-shaping circuitry may be included as desired.

Figure 2:
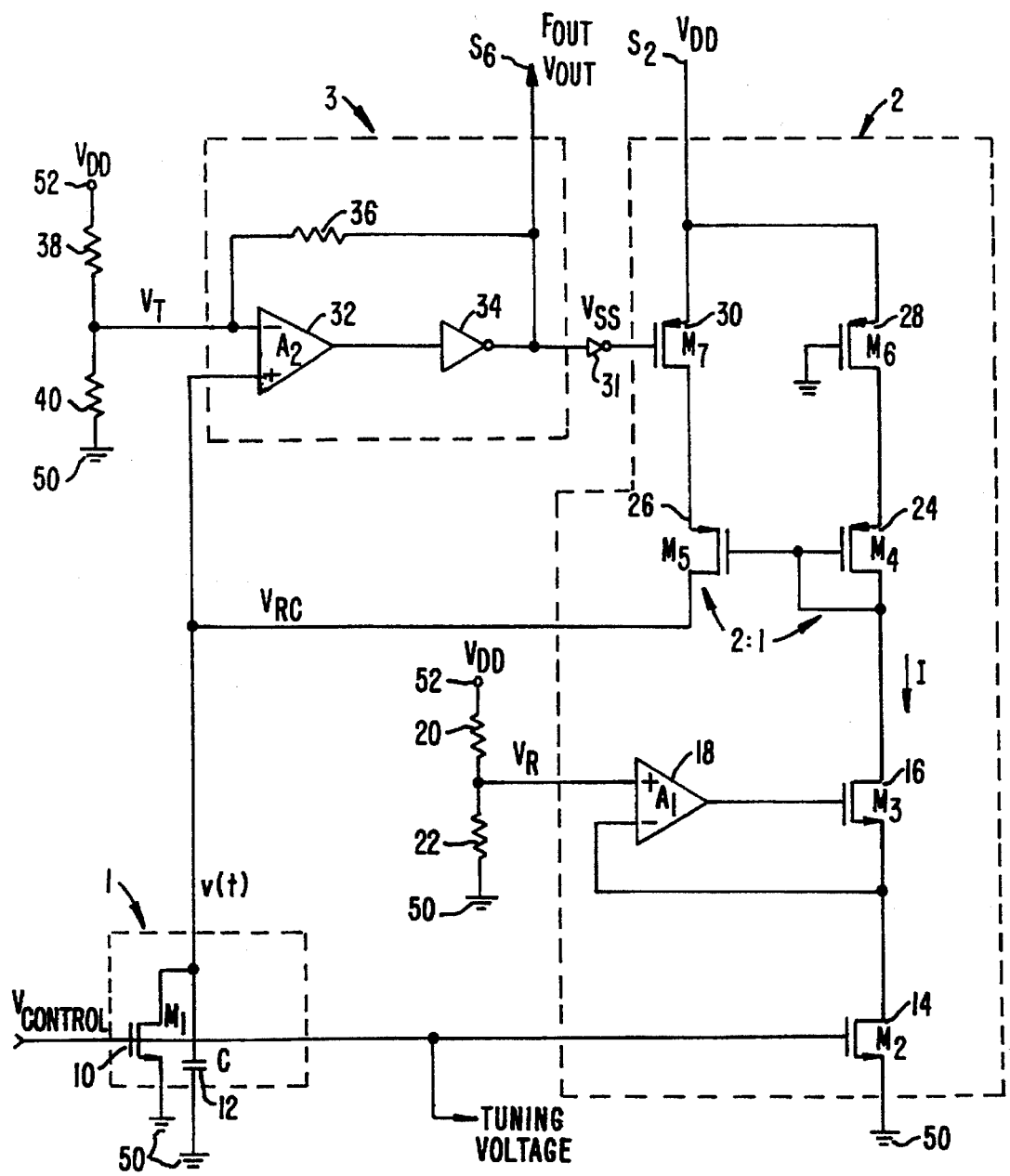
FIG. 2 is a circuit diagram of a preferred embodiment of a VCO according to the present invention.

The circuit will now be described in more detail. Referring to FIG. 2, the resistance element R(v) is provided by the channel resistance $R_{ds1}$ of N channel MOSFET 10 biased in the triode region or linear region, the drain and source of which are connected across a capacitor 12, integrated on the same substrate, and the gate of which is connected to a tuning voltage input. Biasing is achieved by the selection of operating voltages. Typically, the supply voltage=5 V, the drain of MOSFET 10 operates from 0.25 V to 0.9 V, and the control voltage ranges from about 3 V to 5 V. The source of MOSFET 10 and one terminal of the capacitor are connected to ground (negative supply) 50, and the drain of the MOSFET and the other terminal of the capacitor are connected to the output of a voltage-variable constant-current source 2 which will be described in more detail below, and to an input of a comparator with hysteresis 3. The output of the comparator 3 switches the constant current source 2 on and off via switch element 30, which may be a P-channel MOSFET, for example.

The comparator circuit will now be explained. In the circuit shown, the timing element is connected to the non-inverting input of a comparator element 32 which can be constructed as a conventional differential comparator or operational amplifier, and the output of the comparator element 32 is fed through an inverting buffer 34. This signal is fed via another inverting buffer 31 to provide a signal of the correct polarity (i.e., negative for on, positive for off) to drive the P-channel MOSFET switch element 30. The other (inverting) input of the comparator element 32 is connected to a potential divider comprising a resistor 38 connected to positive supply 52, and resistor 40 connected to ground (negative supply input) 50. The output of the inverting buffer 34 is also connected to the inverting input via a resistor 36. The effect of this feedback is that when the output of the inverting buffer 34 is high, which will occur when the output of comparator element 32 is low, i.e., when the voltage across the timing element 1 is less than the voltage at the inverting input, the voltage at the inverting input is raised. Conversely, when the output of the inverting buffer 34 is low, the voltage will be lowered.

Figure 5:
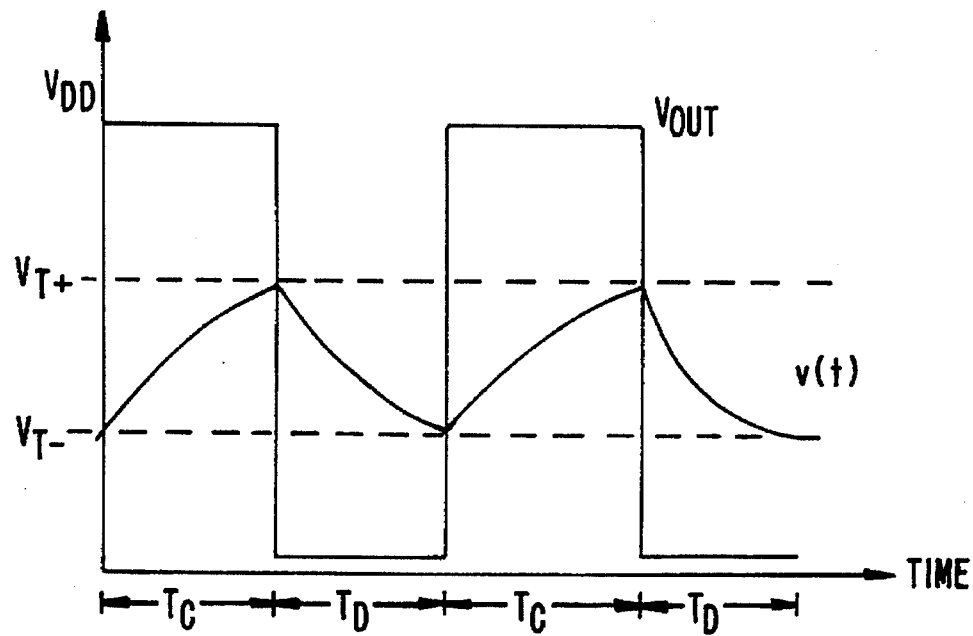
FIG. 5 is a timing diagram showing how the voltages at various points in the circuit vary.

Thus, when the voltage across the timing element 1 is low, the comparator will not switch until a first reference voltage level $V_{T+}$ is exceeded, and when the voltage across the timing element is high, the comparator will not switch until it falls below a second reference level $V_{T-}$, lower than the first. The precise values of these levels will depend on the values of resistors 36, 38, 40, and can be calculated readily by one skilled in the art for given circuit parameters. Typically, $V_{T+} \approx 0.9$ V and $V_{T-} \approx 0.25$ V. It will, of course, be apparent to one skilled in the art that numerous other configurations are possible for providing a comparator with hysteresis and providing a signal of the correct polarity to switch the constant current source 2. For example, the inputs to the comparator 32 may be swapped, in which case the inverting buffer 34 may be dispensed with. The use of buffers may be desirable to maintain signal levels to produce a well-defined waveform. A square wave output can be obtained from any of the comparator element 32 and the buffer 34. Waveforms at the output of the buffer 34 (output voltage) and at the input of the comparator 32 v(t) are shown in FIG. 5

The constant-current source 2 will now be described in more detail. A second voltage-variable resistance element comprising MOSFET 14 in this embodiment has a source connected to the negative supply input (ground) 50, and a gate connected to the tuning voltage input. MOSFET 14 is biased in the triode region, providing a variable resistance $R_{ds2}$ between source and drain terminals. The drain of MOSFET 14 is maintained at a reference voltage $V_R$ by means of a voltage source comprising a differential amplifier 18 and a MOSFET 16 supplied with current from an input arm of a current mirror. The non-inverting input of the amplifier 18 is connected to a reference voltage supplied by a potential divider comprising two resistors 20, 22 connected between the positive supply 52 and the ground 50. The inverting input of the amplifier 18 is connected to the drain of the N channel MOSFET 14, and the output is connected to the gate of N channel MOSFET 16. Thus, if the voltage at the junction of the drain of MOSFET 14 and source of MOSFET 16 is less than the voltage at the junction of resistors 20, 22, the output of the amplifier 18 will be high, driving MOSFET 16 on, thus increasing the current flowing through MOSFET 14 until the voltage across the MOSFET 14 is substantially equal to the reference voltage. Since the current flowing through the gate of MOSFET 16 is negligible, the current supplied to the drain of MOSFET 16 will be substantially identical to the current flowing through the MOSFET 14, which will be equal to the reference voltage divided by the drain-source resistance $R_{DS2}$ of the MOSFET 14. This current is supplied by MOSFET 24 forming the input arm of a current mirror comprising MOSFETs 24 and 26, the MOSFETs being dimensioned to form a current mirror producing an output current substantially equal to twice the input current. This multiple may of course be changed as desired by altering the dimensions of the MOSFETs. The output current may be switched off by means of P channel MOSFET 30, which has a source connected to the positive supply input 52, and a drain connected to the source input of the P-channel MOSFET 26, the output being provided by the drain terminal thereof. A P-channel MOSFET 28 of corresponding properties to MOSFET 30 is coupled between the positive supply input 22 and the source of the MOSFET 24. The gate of MOSFET 28 is coupled to ground. This further MOSFET 28 is provided to balance out the effects of MOSFET 30, so that MOSFETs 24 and 26 have similar positive supply inputs to their source terminals. Thus, when the gate input to MOSFET 30 is low, the output current at the drain of MOSFET 26 will be equal to the predetermined multiple of the current flowing through the MOSFET 14. When the gate input to MOSFET 30 is high, the output current will be substantially zero, as no current will flow through MOSFET 30.

In the above described circuit, MOSFET 14 has substantially identical properties to MOSFET 10, and multiplication of the current is provided by the ratio of the properties of MOSFET 26 to MOSFET 24. It is possible for the properties of MOSFET 14 to differ from those of MOSFET 10. For example, if MOSFET 14 has half the resistance for a given control voltage input as MOSFET 10, a 1:1 current mirror may be provided by MOSFETs 26 and 24 to achieve the same ratio of output current. It is desirable for the output current of the current source to be greater than the current which would flow through MOSFET 10 at the reference voltage (i.e., the current flowing through MOSFET 14 when MOSFETs 14 and 10 are identical), or the voltage across timing element 1 must be significantly lower than the reference voltage, and the comparator must switch between two relatively low threshold voltages. Low-amplitude oscillation in the voltage across timing element 1 may result in instabilities, sensitivity to noise, and problems with maintaining an accurate operating frequency.

Figure 3:
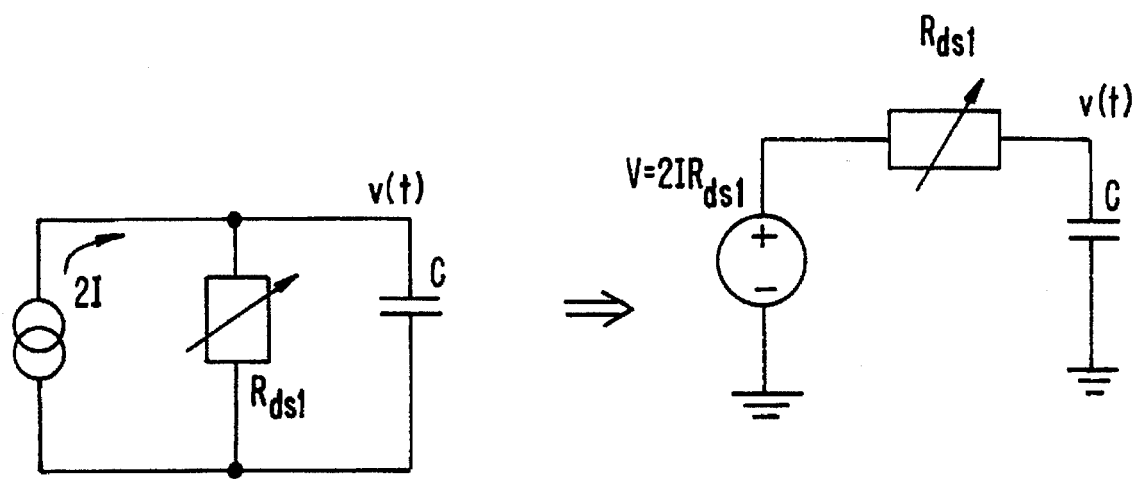
FIG. 3 is a schematic diagram for explaining charging of the timing element.
Figure 4:
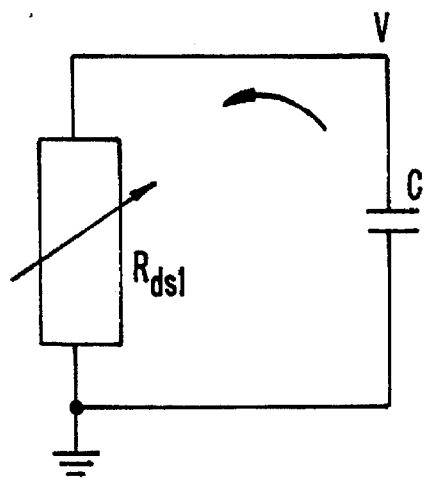
FIG. 4 is a schematic diagram for explaining discharging of the timing element.

The calculation of the operating frequency will be described below with reference to FIG. 3, which shows the effective charging circuit, and FIG. 4, which shows the effective discharging circuit for the capacitor. The times can be calculated as follows.

If the voltage across the capacitor, v(t) equals $V_{T-}$ at time $t_o$, then at subsequent times (t is greater than $t_o$), the voltage across the capacitor (and hence across the timing element) is given by equation (1), where $V=2IR_{ds}$.

$$v(t)=(V-V_{T-})[1-\exp\{-(t-t_o)/R_{ds1}C\}]+V_{T-} \quad (1)$$

When this voltage reaches the upper threshold voltage $V_{T+}$, the current is switched off and the capacitor will discharge through the resistor. If the voltage v(t) across the capacitor equals $V_{T+}$ at time $t_1$, then for subsequent times (t greater than $t_1$), the voltage across the timing element will be given by equation 2:

$$v(t)=V_{T+}\exp\{-(t-t_1)/R_{ds1}C\} \quad (2)$$

Equation 1 can be used to calculate the charge time $t_c$ by solving for $v(t)=V_{T+}$, according to equations 3 and 4.

$$V_{T+}=(V-V_{T-})[1-\exp\{-t_c/R_{ds1}C\}] \quad (3)$$

$$t_c=-R_{ds1}C \ln[1-(V_{T+}-V_{T-})/V-V_{T-})] \quad (4)$$

Similarly, the discharge time can $t_D$ be calculated from equation 2, using equations 5 and 6.

$$V_{T-}=V_{T+}\exp\{-t_D/R_{ds1}C\} \quad (5)$$

$$t_D=R_{ds1}C \ln[V_{T+}/V_{T-}] \quad (6)$$

The oscillator frequency $F=1/(T_C+T_D)$, and this depends on $R_{ds1}$, C, V, $V_{T+}$, and $V_{T-}$, where $V=2I\,R_{ds1}$ and where $R_{ds1}$ is the resistance R(V) of MOSFET 10, and $R_{ds2}$ is the resistance of MOSFET 14.

2I is the output from the current source comprising a 2:1 current mirror, and is equal to twice the current flowing through MOSFET 14, so $I=V_R/R_{ds2}=V_R/R_{ds1}$ (because MOSFET 14 is identical to MOSFET 10), so $V=2V_R$, the resistance of the MOSFET channel being cancelled out. If the ratio of the current mirror is different, V will vary accordingly. From equation 4, it can be seen that if $V \leq V_{T+}$, $t_c$ becomes undefined (i.e. oscillation is not possible) because the capacitor can never charge to $V_{T+}$.

$V_{T+}$, $V_{T-}$, and $V_R$ are, in this embodiment, provided by potential dividers, so all are directly proportional to the supply voltage.

Therefore, the term $(V_{T+}-V_{T-})/(V-V_{T-})$ in equation 4 has both numerator and denominator proportional to supply voltage, so is independent of supply voltage. Similarly, the term $V_{T+}/V_{T-}$ in equation 6 is independent of supply voltage.

Thus, the oscillator frequency will be substantially independent of supply voltage and is substantially dependent on the RC time constant of the timing element, which is controlled by the tuning voltage.

Figure 6:
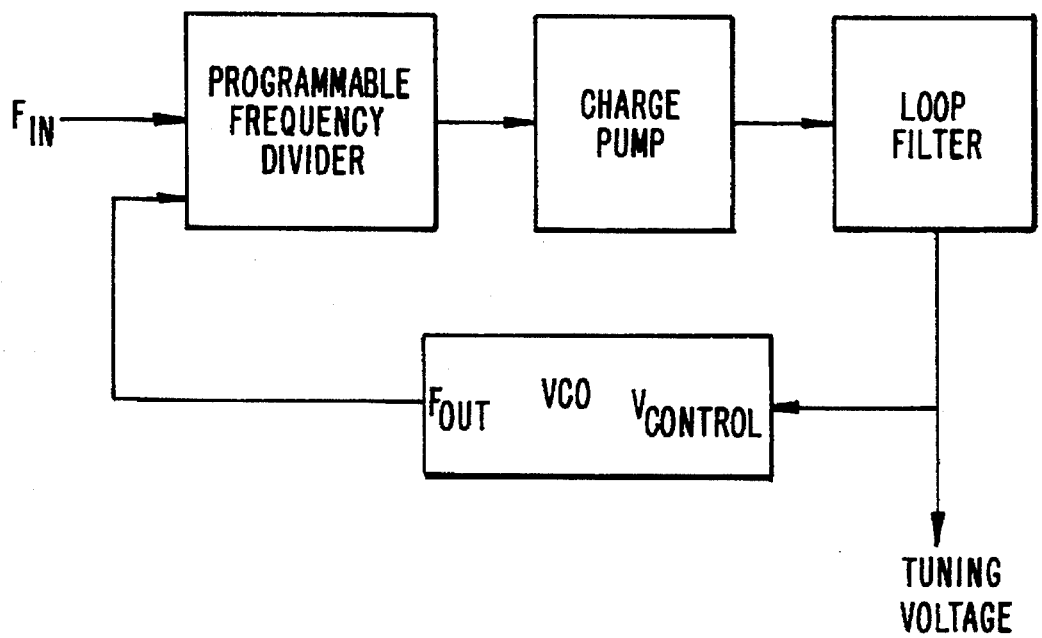
FIG. 6 is a block diagram of a PLL in which the VCO of the invention can be incorporated.

The circuitry responsible for determining the frequency of the voltage controlled oscillator is a parallel RC network, of which one terminal is connected to ground, and this combination can be used in a filter, such as a continuous-time filter. The resistor ratios which set $V_{T-}$ and $V_{T+}$ can be known to a high degree of accuracy by monolithic matching. The VCO can be incorporated in a PLL as shown in FIG. 6. A filter and VCO combination may be employed in an Ethernet transceiver, for example.

The VCO may be connected between a positive supply and ground, or between positive and negative supplies. References to ground in this specification and claims shall be construed as references to any voltage level to which circuitry outside the VCO can be related, including a negative supply voltage.

Figure 7:
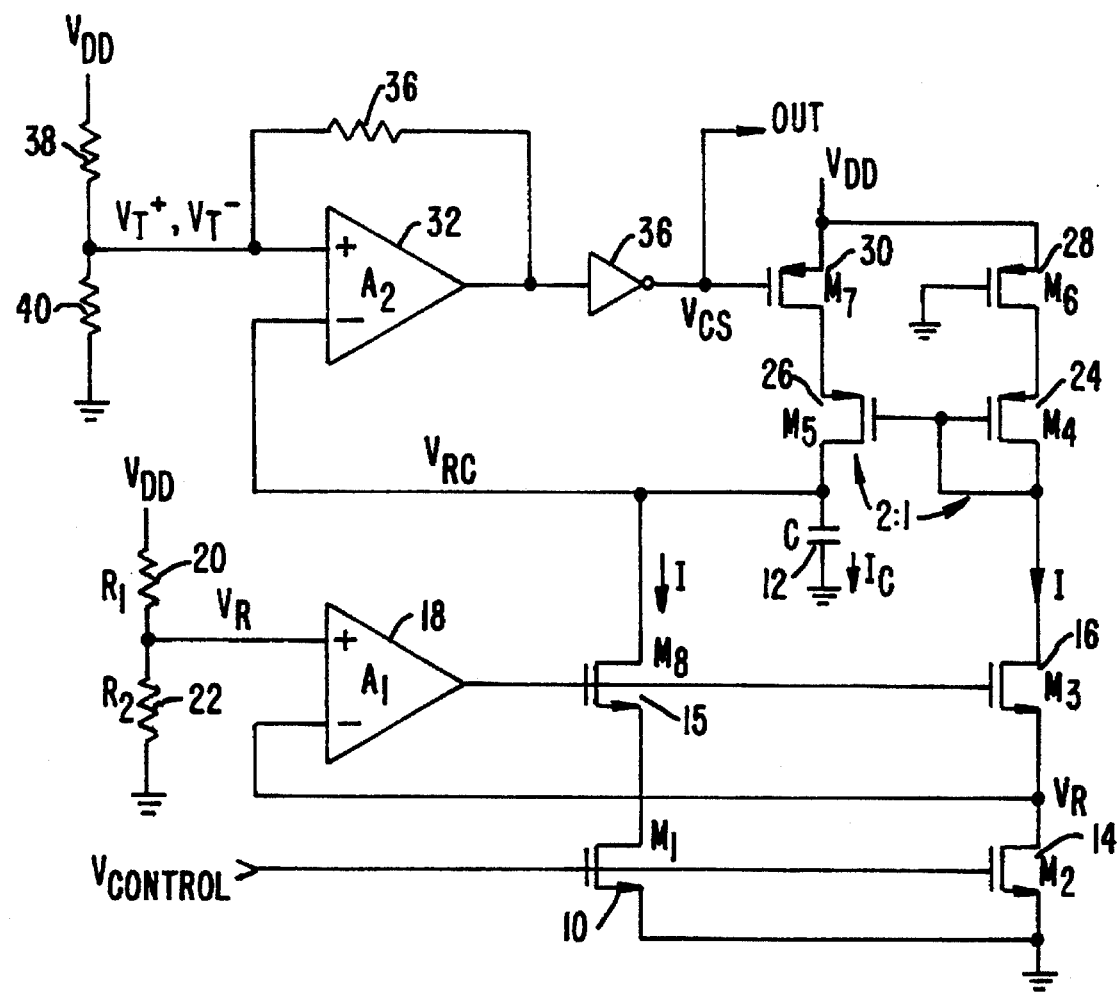
FIG. 7 is a circuit diagram of another embodiment of a VCO according to the present invention.

FIG. 7 shows another embodiment of the present invention. In the embodiment shown in FIG. 2, the frequency controlling voltage-variable resistor 10 (MOSFET M1 in the triode region) was kept in the triode region by virtue of the fact that the two thresholds of comparator $A_2$ were kept near a ground potential (typical threshold values were 0.25 V and 0.9 V, respectively). In some instances, it might be desirable for the threshold voltages to be further apart for less sensitivity to noise. Also, as the capacitor voltage varies throughout the charge/discharge cycle, the MOSFET drain voltage is varying as well, and there is a small modulation of the drain resistance. This produces the conflicting requirements of a large voltage swing of capacitor voltage for noise immunity, but a small voltage swing for minimal modulation of drain resistance.

In the embodiment of FIG. 7, a "shield" transistor 15 is used to pin the drain of transistor M1 to a constant voltage, keeping both the drain resistance and the drain current constant as a consequence. The drain of the shield or cascode transistor 15 has the same voltage as the capacitor (varying over time) on its drain, but isolates the drain of the voltage-variable resistor M1.

The operation of this circuit is somewhat different from the embodiment of FIG. 2, due to the fact that the current Ic through the capacitor C switches between +I and −I instead of following the previous exponential curve typical of an RC network.

Assume for analysis that the $V_{RC}$ starts at 0 V. Vcs will then be 0 V, which turns on P-channel device $M_7$. This enables a current of magnitude 2I to flow out of the drain of $M_5$. This current will split at node $V_{RC}$, resulting in a current I flowing into M₈ and another current I flowing into capacitor C. Note that drain current of M₈ must equal I since the ratios of M₈ and M₁ are matched to the ratios of M₃ and M₂, which establishes the drain current I for M₃ dependent on $V_R$ and the drain resistance of M₂. If control is sufficiently high in voltage relative to $V_R$, M₁ and M₂ will both be in the triode region.

Capacitor C now charges until $V_{RC}$ reaches upper threshold voltage $V_{T+}$, at which time A₂ switches and $V_{cs}$ goes to $V_{DD}$, turning off M₇. This results in C being discharged by current I into M₈. The discharge continues until $V_{RC}$ reaches lower threshold voltage $V_{T-}$, and the cycle then repeats indefinitely.

Note that this circuit retains the unique idea of basing the charge/discharge current on a voltage proportional to $V_{DD}$ and on the resistance of a MOSFET matched to M₁. When the thresholds $V_{T+}$ and $V_{T-}$ are also based on $V_{DD}$, the $V_{DD}$ dependence of the oscillator frequency is very small; i.e. the frequency depends substantially on M₁–C, as is desired. Derivation of the frequency is as follows:

$$\text{Charge: } I_c = C \frac{dV_{RC}}{dt} \rightarrow I_c = C \frac{\Delta V_{RC}}{t_{CH}}$$

($I_C$ is constant for whole charge portion of cycle)

$$\Delta V_{RC} = V_{T+} - V_{T-} \quad I_C = V_R/R_{ds2}$$

$$t_{CH} = \frac{C(C_{T+} - V_{T-})}{V_R/R_{ds2}} = R_{ds2} C \frac{V_{T+} - V_{T-}}{V_R}$$

Note, if $V_{T+}$, $V_{T-}$, $V_R$ are all proportional to $V_{DD}$, the $V_{DD}$ term cancels out.

$$\text{Discharge: } I_C = \frac{C \Delta V_{RC}}{t_{DCH}}$$

$$\Delta V_{RC} = V_{T-} - V_{T+} \quad I_C = -\frac{V_R}{R_{ds2}}$$

$$t_{DCH} = \frac{C(V_{T-} - V_{T+})}{-V_R/R_{ds2}} = R_{ds2} C \frac{V_{T+} - V_{T-}}{V_R} = t_{CH}$$

$$F_{out} = \frac{1}{t_{dch} + t_{CH}} = \frac{1}{2 t_{ch}} = \frac{V_R}{2 R_{ds2} C (V_{T+} - V_{T-})} =$$

$$\frac{V_R}{2 R_{ds1} C (V_{T+} - V_{T-})}$$

One of the advantages of the enhanced circuit shown in FIG. 7 is that the drain of M₁ is kept at an approximately constant voltage, which implies a constant drain resistance. The oscillator frequency is dependent on this resistance. The circuit shown in FIG. 2 made the implicit assumption that the drain resistance "averaged" to a nominal value equal to that of M₂ as the drain voltage varied. This assumption does not need to be made with the enhanced circuit.

Keeping M₁ under the same bias conditions as M₂ also implies that a constant current flows in M₁ (as it does in M₂). This means that the capacitor current will be either I if M₇ is on or –I if M₇ is off. The linear charge and discharge rate of C that results makes the analysis and design of the circuit straightforward and gives a simple control of the duty cycle. The circuit and analysis in FIG. 2 assumes a current mirror ratio of 2:1 on M₅ to M₄, which results in a 50% duty cycle. By changing the current mirror ratio from 2:1 (but always remaining greater than 1:1), the duty cycle can be varied in a direct fashion that is easy to calculate.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

For example, the current mirror comprised of MOSFET 24 and 26 can be cascoded to approximate an ideal current mirror more closely. The switching element comprising MOSFET 30 may be improved to result in rapid turn-off of the supply of current; in the illustrated circuit, when the current is switched off, MOSFET 30 is high impedance, so the current is not immediately switched off, due to parasitic capacitance holding the source of MOSFET 26 high. In the preferred embodiment, this effect is minimized by keeping the oscillation frequency relatively low (typically of the order of 1 MHz).

What is claimed is:

1. A voltage controlled oscillator having a tuning voltage input, the oscillator comprising a RC timing element comprising a voltage-variable resistance element and a capacitor, and a current source having an output providing an output current, wherein said tuning voltage input is coupled to said voltage-variable resistance element to vary the resistance thereof, and to said current source to vary the output current thereof, said capacitor being coupled to said output of said current source to receive said output current.

2. The voltage controlled oscillator according to claim 1 wherein said current source includes a further voltage-variable resistance element having a control input coupled to the tuning voltage input.

3. The voltage controlled oscillator according to claim 1 wherein said voltage-variable resistance element comprises a MOSFET having gate, drain and source connections, and wherein the resistance is provided between the drain and source connections, the gate connection being coupled to the tuning voltage input.

4. The voltage controlled oscillator according to claim 2 wherein the further voltage-variable resistance element comprises a MOSFET having gate, drain and source connections, and wherein the resistance is provided between the drain and source connections, the gate connection being coupled to the tuning voltage input.

5. The voltage controlled oscillator according to claim 1 wherein the voltage-variable resistance element and the capacitor are connected in parallel.

6. The voltage controlled oscillator according to claim 2 wherein the output current of the current source is proportional to a current flowing through the further voltage-variable resistance element.

7. The voltage controlled oscillator according to claim 6 wherein the further voltage-variable resistance element is supplied with a reference voltage.

8. The voltage controlled oscillator according to claim 6 wherein the current source includes a current mirror.

9. The voltage controlled oscillator according to claim 3 further comprising a switch element coupled to the output of the current source to switch said output current.

10. The voltage controlled oscillator according to claim 9 further comprising a comparator having an input coupled to the timing element and an output coupled to the switch element to switch the output current in dependence on a voltage at said input.

11. The voltage controlled oscillator according to claim 9, further comprising a shield transistor coupled to said switch element for holding said drain of said MOSFET at a relatively constant voltage.

12. A voltage controlled oscillator having first and second supply voltage inputs, a tuning voltage input, and an oscillating voltage output having a frequency, the oscillator comprising:

a timing element comprising a first voltage-variable resistance element providing a resistance between first and second connections coupled to a capacitor to define an RC timing-element having a time-constant, and having a timing control voltage input coupled to said tuning voltage input for adjusting the resistance of said first voltage-variable resistance element;

a current source coupled between said first and second supply voltage inputs and having output circuitry providing an output current at a current output connection, the magnitude of said output current being controlled in proportion to the current flowing through a second voltage-variable resistance element supplied with a reference voltage, said current source having a current control voltage input coupled to said tuning voltage input for adjusting the resistance of said second voltage-variable resistance element, and a switch element for switching the output current on and off; and a comparator with hysteresis having an input and an output, said output switching to a first voltage when said input has a voltage above a first reference level, and to a second voltage when said input has a voltage below a second reference level lower than said first reference level;

wherein said timing element is coupled to said current output of said current source so that said capacitor can be supplied with said output current, and to the input of said comparator, the output of said comparator being connected to the switch element of said current source so that the output current is switched on when a voltage across the timing element falls below the second reference level to charge the capacitor, and switched off when the voltage across the timing element rises above the first reference voltage to enable the capacitor to discharge through the first voltage-variable resistance element, thereby to produce an oscillating voltage across the timing element, from which said oscillating voltage output is obtained.

13. The voltage controlled oscillator according to claim 12 wherein said oscillating voltage output is obtained at said comparator output.

14. The voltage controlled oscillator according to claim 12 wherein said first and second voltage-variable resistance elements comprise MOSFETs each having a drain connection and a source connection providing a resistance therebetween, and a gate connection for receiving a control voltage input for adjusting said resistance.

15. The voltage controlled oscillator according to claim 14 wherein said MOSFETs are biased in a triode region.

16. The voltage controlled oscillator according to claim 14 wherein said MOSFETs have substantially identical properties.

17. The voltage controlled oscillator according to claim 12 wherein said current source includes a current mirror arranged to produce a current output equal to a multiple of the current flowing through said second voltage-variable resistance element.

18. The voltage controlled oscillator according to claim 12 wherein said current source comprises a voltage source for maintaining a reference voltage across said second voltage-variable resistance element.

19. The voltage controlled oscillator according to claim 18 wherein said voltage source includes an operational amplifier having a first input coupled to a reference voltage, and a second input coupled to said second voltage-variable resistance element, and an output coupled to a gate of a field effect transistor arranged to supply current to said second voltage-variable resistance element to maintain the voltage across said second voltage-variable resistance element equal to said reference voltage.

20. The voltage controlled oscillator according to claim 19 wherein said first input is a non-inverting input, said second input is an inverting input, and said field effect transistor is an N-channel MOSFET.

21. The voltage controlled oscillator according to claim 19 wherein said current source includes a current mirror having an input arm and an output arm, and wherein said field effect transistor is coupled to draw current from the input arm of said current mirror, said current mirror being connected to produce an output current at said output arm substantially equal to a predetermined multiple of the current drawn from said input arm, said output current being provided at said current output connection of said current source.

22. The voltage controlled oscillator according to claim 17 wherein said multiple is 2.

23. The voltage controlled oscillator according to claim 12 wherein said switch element is arranged to interrupt a supply to said output circuitry of the current source.

24. The voltage controlled oscillator according to claim 23 wherein said switch element comprises a MOSFET having a source coupled to a supply voltage input, a drain coupled to said output circuitry, and a gate coupled to the output of said comparator.

25. The voltage controlled oscillator according to claim 24 wherein said comparator has a resistor element coupled to said output for providing positive feedback, and wherein said gate is coupled to said output by an inverting buffer.

26. The voltage controlled oscillator according to claim 14, further comprising a shield transistor coupled to said switch element for holding said drain of said first voltage-variable resistance element at a relatively constant voltage.

27. The voltage controlled oscillator according to claim 12 wherein one of the first supply voltage input and the second supply voltage input is connected to ground.

28. The voltage controlled oscillator according to claim 12 wherein said comparator includes a positive-feedback element.

29. The voltage controlled oscillator according to claim 12 wherein said first and second reference levels and said reference voltage are proportional to the supply voltage between said first and second supply voltage inputs.

30. The voltage controlled oscillator according to claim 12 wherein said voltage-variable resistance element and said capacitor are connected in parallel.

31. The voltage controlled oscillator according to claim 27 wherein one of said first and second connection of said first voltage variable resistance element is connected to ground.

32. An integrated circuit comprising a voltage controlled oscillator according to claim 12, and at least one further timing element, said at least one further timing element comprising a third voltage-variable resistance element having a further control input and a further capacitor, wherein said tuning voltage input is coupled to said further control input.

33. The integrated circuit according to claim 32, wherein said at least one further timing element is incorporated in a filter circuit.

34. The integrated circuit according to claim 32 having a reference frequency input and comprising circuitry for adjusting the frequency of said oscillating voltage output to track said frequency input.

35. The integrated circuit according to claim 33 wherein said voltage controlled oscillator comprises a phase-locked loop (PLL).

36. An Ethernet transceiver comprising an integrated circuit according to claim 32.

* * * * *

UNITED STATES PATENT AND TRADEMARK OFFICE
CERTIFICATE OF CORRECTION

PATENT NO. : 5,644,270

DATED : July 1, 1997

INVENTOR(S) : Todd K. Moyer; Daniel M. Clementi

It is certified that error appears in the above-identified patent and that said Letters Patent is hereby corrected as shown below:

On the title page: Item: Column 1, line 1,
   [54] "ENCHANCED" should be replaced with --ENHANCED--.

Signed and Sealed this

Fourteenth Day of October, 1997

Attest:

BRUCE LEHMAN

*Attesting Officer*     Commissioner of Patents and Trademarks